United States Patent [19]

Bezek

[11] Patent Number: 5,469,161
[45] Date of Patent: Nov. 21, 1995

[54] ALGORITHM FOR THE IMPLEMENTATION OF ZIV-LEMPEL DATA COMPRESSION USING CONTENT ADDRESSABLE MEMORY

[75] Inventor: John D. Bezek, Owego, N.Y.

[73] Assignee: International Business Machines Corporation, Armonk, N.Y.

[21] Appl. No.: 930,136

[22] Filed: Aug. 13, 1992

[51] Int. Cl.$^6$ .................................................. H03M 7/30
[52] U.S. Cl. .................................... 341/51; 341/106
[58] Field of Search .............................. 341/51, 106, 50

[56] References Cited

U.S. PATENT DOCUMENTS

| | | |
|---|---|---|
| 4,558,302 | 12/1985 | Welch . |
| 5,003,307 | 3/1991 | Whiting et al. ............... 341/51 |
| 5,151,697 | 9/1992 | Bunton ........................... 341/51 |
| 5,339,076 | 8/1994 | Jiang .............................. 341/51 |

*Primary Examiner*—Marc S. Hoff
*Attorney, Agent, or Firm*—Whitham, Curtis, Whitham & McGinn; Michael E. Belk

[57] ABSTRACT

A data processing system is provided with a system to implement a form of data compression—the Ziv-Lempel or Ziv-Lempel-Welsh (ZLW) algorithm—in those systems which incorporate a content addressable memory (CAM), also known as an associative memory. Such implementation results in significant processing performance improvement in the data compression and decompression phases. The ZLW algorithm is widely used in industry and government to realize the reduction in amount of storage space needed for various forms of computer system data files. The processing to result in a LZW compressed file, or the inverse decompress operation, consumes significant computer resources. Such resource and time is justified realizing the savings in amount of computer main and secondary stores needed to retain various data files. The algorithms presented here-in are a significant variation on the basic ZLW theme. Utilizing a CAM memory for high speed data table searching, the novel algorithms result in a standard ZLW format compressed file.

9 Claims, 5 Drawing Sheets

1. INITIALIZE STRING TABLE, I.E. CAM LOCATIONS, TO EMPTY. THEN FILL 256 LOCATIONS WITH THE CODE VALUES FOR THE INITIAL LITERAL CHARACTERS IN THE CHARACTER SET. THESE TAKE THE FORM: (SEE FIGURE 6 AND THE TEXT FOR FORMAT AND DESCRIPTION)

$$X \leftarrow NULL + X$$

WHERE $X \in [0..255]$. THIS IS AN EXAMPLE INITIALIZATION USING AN 8 BIT CHARACTER ENCODING SUCH AS EBCDIC OR EXTENDED ASCII.

2. SET THE CURRENT BASE VALUE AND BUILDING STRING TO NULL. THESE ARE VARIABLES LOCAL TO THIS ALGORITHM

3. TOP OF WHILE LOOP WHICH EXECUTES UNTIL ALL INPUT DATA IS EXHAUSTED.
    IF INPUT DATA EXHAUSTED
       WRITE OUT CONTENTS OF BUILDING STRING, IF STRING IS NON-NULL,
       STOP.

4. READ CHARACTER FROM INPUT AND APPEND IT TO THE BUILDING STRING.

5. PERFORM A MATCH OPERATION USING THE INPUT CHARACTER AND CURRENT BASE VALUE AGAINST THE CAM FIELDS APPEND CHARACTER AND BASE CODE VALUE RESPECTIVELY. CHECKS IF THE INPUT STRING, UP TO THE CURRENT CHARACTER READ, IS ALREADY IN THE STRING TABLE.

6. IF STRING IN STRING TABLE, I.E. CAM MATCH OF PREVIOUS STEP SUCCESSFUL
       SET CURRENT BASE VALUE TO BASE CODE VALUE FROM MATCHING CAM WORD. IF THE BASE CODE VALUE IS NULL THEN USE THE CHARACTER ENCODING VALUE FOR THE CHARACTER JUST INPUT.
       GO TO STEP 2. ITERATE THE LOOP.
    OTHERWISE:

7. OUTPUT THE CURRENT BASE CODE VALUE. THIS IS THE LATEST MATCHING STRING

8. PERFORM A MATCH IN THE CAM USING THE CURRENT BASE VALUE AGAINST THE NEW CODE VALUE FIELD. THIS WILL LOCATE THE UNIQUE CAM ENTRY WHICH IS THE REPRESENTATION OF THE STRING WHO'S CODE VALUE WAS JUST OUTPUT. INCREMENT THE USE COUNT FIELD OF THAT CAM ENTRY.

9. WRITE NEW STRING TABLE ENTRY, I.E. OUTPUT TO CAM, USING CURRENT BASE VALUE AS THE BASE CODE VALUE, CURRENT INPUT CHARACTER AS THE APPEND CHARACTER AND THE NEXT LARGER UNUSED BASE CODE VALUE AS THE NEW CODE VALUE.

10. SET THE BUILDING STRING TO CONTAIN ONLY THE CURRENT INPUT CHARACTER.
    SET THE CURRENT BASE VALUE TO THE CHARACTER ENCODING VALUE FOR THE CHARACTER JUST INPUT.
    THIS STARTS THE CONSTRUCTION OF A NEW STRING PATTERN.

11. GO TO STEP 2. BOTTOM OF WHILE LOOP.

FIG.5

TOTAL WORD WIDTH: 56 BITS

| NEW CODE VALUE 16 | BASE CODE VALUE 16 | USE COUNT 16 | APPEND CHARACTER 8 |
|---|---|---|---|

BIT FIELD SIZES

FIG.6

| INPUT | STRING TABLE OPERATION | OUTPUT | (AT COMPLETION OF EACH STEP) "BUILDING" STRING | CURRENT BASE VALUE |
|---|---|---|---|---|
| T | --- | - | T | 084 |
| h | 256 <- 084 + h | T | T + h | 104 |
|  |  |  |  |  |
| i | 257 <- 104 + i | h | h + i | 105 |
| s | 258 <- 105 + s | i | i + s | 115 |
|  |  |  |  |  |
| ƀ | 259 <- 115 + ƀ | s | s + ƀ | 032 |
| h | 260 <- 032 + h | ƀ | ƀ + h | 104 |
|  |  |  |  |  |
| o | 261 <- 104 + o | h | h + o | 111 |
| t | 262 <- 111 + t | o | o + t | 116 |
|  |  |  |  |  |
| e | 263 <- 116 + e | t | t + e | 101 |
| l | 264 <- 101 + l | e | e + l | 108 |
|  |  |  |  |  |
| ƀ | 265 <- 108 + ƀ | l | l + ƀ | 032 |
| i | 266 <- 032 + i | ƀ | ƀ + i | 105 |
|  |  |  |  |  |
| s | --- | - | i + s | 258 |
| ƀ | 267 <- 258 + ƀ | 258 | i + s + ƀ | 032 |
|  |  |  |  |  |
| h | --- | - | ƀ + h | 260 |
| i | 268 <- 260 + i | 260 | ƀ + h + i | 105 |
|  |  |  |  |  |
| s | --- | - | i + s | 258 |
| ƀ | --- | - | i + s + ƀ | 267 |
|  |  |  |  |  |
| h | 269 <- 267 + h | 267 | i + s + ƀ + h | 104 |
| o | --- | - | h + o | 261 |
|  |  |  |  |  |
| m | 270 <- 261 + m | 261 | h + o + m | 109 |
| e | 271 <- 109 + e | m | m + e | 101 |
|  |  |  |  |  |
| . | 272 <- 101 + . | e | e + . | 046 |
|  |  | . | . | 046 |

FIG.8

1. PATTERN MATCH CAM MARKING WORDS WHICH HAVE THE USECOUNT < = PRUNE THRESHOLD

2. PICK ONE OF THE MARKED CAM WORDS FROM STEP 1 AND UNMARK IT. IF NO WORDS REMAIN MARKED THEN EXIT. STEPS 2 THROUGH 6 FORM A WHILE LOOP WHICH CONTINUES AS LONG AS A MARKED WORD, WHICH HAS POTENTIAL FOR BEING REMOVED FROM THE STRING TABLE, REMAINS IN THE CAM.

3. IF THE BASE CODE VALUE OF THE WORD SELECTED IN STEP 2 IS NULL THEN GO TO STEP 2. NULL INDICATES THAT THE SELECTED CAM WORD IS ONE OF THE INITIAL LITERAL CHARACTERS IN THE STRING TABLE. THE ORIGINAL LITERAL CHARACTERS ARE NOT DELETED FROM THE TABLE. SEE FIGURE 5 ON PAGE 1, STEP 1, FOR THE INITIALIZATION STEP OF THE LITERAL CHARACTERS.

4. EXTRACT THE NEW CODE VALUE FROM THE WORD OF STEP TWO. PERFORM A CAM MATCH USING THE NEW CODE VALUE AGAINST THE BASE CODE VALUE FIELD. THE MATCH AGAINST THE BASE CODE VALUES DETERMINES IF THIS CODE WORD, INDICATED BY THE NEW CODE VALUE, PLUS APPEND CHARACTER ARE USED IN LONGER STRINGS. IF THEY ARE THEN THIS CODE WORD ENTRY IN THE STRING TABLE CANNOT BE DELETED.

5. IF NO MATCHES OCCUR IN THE CAM
REMOVE THE CAM WORD ENTRY SELECTED IN STEP 2. DELETE THE STRING WITH LOW USE COUNT.
EXTRACT THE BASE CODE VALUE FROM THE WORD OF STEP 2. MARK THAT CAM ENTRY WHICH HAS IT'S NEW CODE VALUE EQUAL TO THIS BASE CODE VALUE. THIS EFFECTIVELY BACKS UP ONE CHARACTER IN THE ORIGINAL INPUT STRING AND WILL ALLOW THAT ONE CHARACTER SMALLER STRING TO BE POTENTIALLY DELETED FROM THE STRING TABLE.

6. GO TO STEP 2.

FIG. 7

ALGORITHM FOR THE IMPLEMENTATION OF ZIV-LEMPEL DATA COMPRESSION USING CONTENT ADDRESSABLE MEMORY

FIELD OF THE INVENTION

The present invention relates to computers or computer systems which perform data compression, compaction, tersing, etc. (and the inverse operation of expansion, untersing, etc.) and particularly to such systems which employ content addressable memories.

GLOSSARY OF TERMS

While dictionary meanings are also implied by certain terms used here, the following glossary may be useful.

Computer: Any general purpose or specialized computing machine having at least an ALU (Arithmetic Logic Unit), a memory (general purpose store) and an operating system capable of handling and processing instructions and data which is to be processed in accordance with an instruction sequence processed by the computer, generally thought of as a computer system.

Computer system: A computer which may include additional elements and generally does include a numbers of such elements which interact to perform a planned function. Such elements may generally include mass storage for instructions and data, special stores for repetitive instructions, input and output functional elements including display, communication and printing interfaces and connections. A Turing machine is an example of a computer system, but generally computers employ more elements. An Enterprise Systems Architecture/390 machine is a computer system, and similarly a RISC/6000 is one[1].

[1]Enterprise Systems Architecture/390, ESA/390, S/360, S/370 and RISC/6000 are trademarks of International Business Machines Corporation, Armonk, N.Y., U.S.A.

Content Addressable Memory: A storage device or subsystem or part of another memory system where data and instructions are defined by their contents or by a part of their contents rather than by their names and positions (addresses typically used by general purpose computers). Computers can have a CAM as well as additional storage. Commercially, in the past, CAMs have been used in large parallel machines. Examples would include large ESA/390™ computers, but other smaller systems have had such CAMs. In CAMs data are generally either addressed or accessed in an associative fashion from storage. A CAM at the minimum comprises two elements, a store (typically a CAM memory array) and a pattern register. It may also include a mask register, and typically it includes a match register. Also referred to as associative storage or associative memory.

CAM: See Content Addressable Memory.

Co-processor: A computer element which acts in concert with another primary computer element. Co-processors have typically been assigned specific processing tasks to perform, e.g. to handle either application programming—e.g. word processing; or I/O (input/output)—e.g. printing. Some co-processors may be used to process routines also handled by other co-processors of the same computer system.

General purpose computer: A computer which is not designed to perform too specialized a task. A general purpose computer may be of the kind represented by many machines in commercial use variously referred to as mainframes, workstations, and as business, personal or scientific computers. These machines may process instructions and data in serial and or in parallel. The word length may vary. These general purpose computers operate with a base operating system, may utilize additional operating systems, and have the capability of processing a program (software) written for use by the system. When the program is run, the operating system operates with instructions which are originally formulated for use by the computer for the particular operating system itself by processing a program by an interpreter or compiler. The interpreted or compiled program has been written in either a high level language or an assembler language by a person, or by extraction from other programs available to the system.

Language A set of characters or conventions and rules that is used for conveying information as a programming directive in a computer system. A language construct in a programming language is a syntactically allowable program or subroutine that may be constructed in accordance with the set of rules that make up the grammar of the language of a computer system. The grammar of the language is used as a paradigm for the computer to follow in processing operations. It defines the steps and sequences which are to be used in processing information to and from elements of the system including the ALU and storage. The language or language construct is the entire set of grammar used by the computer. A language sub-set is a specific defined pad of the language construct.

The language is implemented by a program entry in the form of a language statement provided by a user. The language and specific language subsets are the building blocks by which users make computers perform tasks for them.

Mask register: A component of a CAM which acts like a filter through which data in the pattern register is filtered before the memory array of the CAM is addressed or accessed.

Memory Array: A group of storage or memory cells organized so that several strings of interrelated data, such as used in a relational data base, can be addressed or accessed and examined as to contents at the same time.

Paradigms: Models or sets of computer operation control which may be used by a language but may be language independent. It is a basic computer relationship building block and defines a set of operations of a computer.

Parallel computer: A computer which processes words or parts of words in parallel through an arithmetic logic unit or information processing unit (ALU) system as differentiated from serial processing.

Pattern register: A component of a CAM which stores the criteria for evaluating data stored within the CAM memory array. The pattern register data is used to determine which, if any, datum rows within the memory array satisfy the desired search criteria.

ZLW Ziv-Lempel-Welch data compression/decompression algorithms.

ZLWCAM Present invention: variation on the basic Ziv-Lempel-Welch data compression/decompression algorithms to incorporate content addressable memory for improved data processing performance.

REFERENCES USED IN THE DISCUSSION OF THE INVENTIONS

During the detailed description which follows, the following work will be referenced as an aid for the reader.

1. Apiki, Steve, "Lossless Data Compression," Byte, Vol. 16, No. 3, March 1991, pp. 309–312, 314, 386, 387.

BACKGROUND OF THE INVENTIONS

The Ziv-Lempel data compression algorithm, also sometimes referred to as the Ziv-Lempel-Welch (ZLW) algorithm, is commonly and widely used for the compression of data. ZLW is a loss-less compression algorithm meaning that it can be used with all types of data streams: the data after decompression, or expansion, is identical to the original data. Thus, this data compression method is not limited to a particular type of data; a particular type of application, such as video image compression; nor a particular type of data representation, i.e. a particular bit stream representation of real world data.

ZLW is believed to be patented by the Sperry Corporation. It is used by commercial programs and services. These include:

CompuServe—the GIF file format,
Unix—the compress operation,
PKWare Inc.—the PKZIP data compression program.

The only patent of SPERRY that has been found is U.S. Pat. No. 4,558,302 which does not mention Ziv and Lempel who have been credited with origination of the ZL development.

ZLW consists of two operations: a compression operation and an expansion operation. Both use data tables which arc built from the respective input data stream during the operation. The major component of both operations is the need to perform a match of the current input character or string against the entries already accumulated in the data table.

The computer system processing which results in a ZLW compressed file, or the inverse decompress operation, consumes significant computer resources. Such resource usage and the overhead time spent is justified by the savings in the amount of computer main storage and secondary storage, such as disk and tape, needed to retain the various data files.

Included is a necessary string entry table data pruning algorithm. The processing method of ZLW is to grow a dynamic data string table from the input data based on the contents and characteristics of the data. This table requires periodic pruning during the course of ZLW processing. ZLWCAM imposes similar requirements to prune the data string table.

SUMMARY OF THE INVENTION

Using an alternative form of computer system which has a known, but unusual memory device device: the content addressable memory (CAM), which is also known as Associative Memory the present invention enables the more efficient performance of handling a ZLW format, which we will describe as ZLW implemented on CAM, which will be referred to as ZLWCAM.

The algorithms presented herein are a significant variation on the basic ZLW theme. Utilizing a CAM for high speed dynamic data table searching, the novel algorithms, ZLWCAM, result in a standard ZLW format compressed file. The algorithms make use of the concurrent matching capabilities of the CAM. This implementation results in significant processing performance improvement in the data compression and decompression phases of data storage and retrieval.

Content addressable memory (CAM) when implemented with the invention is particularly well suited to this type of string matching. It can be employed in operations which do large amounts of character and string matching to realize significant performance improvements.

This disclosure describes a straight forward algorithm for the basic ZLW data compression algorithm, implementing ZLW on a content addressable memory. This new paradigm is referred to as ZLWCAM.

In accordance with the invention, the computer system is provided with a content addressable memory, and as configured the ZLWCAM paradigm fits into either the application program or as part of the computer operating system to interface the application program to the various main and secondary store with and content addressable memories. Such placement of the paradigm allows for the implementation, of efficient and accelerated ZLW data compression and decompression using the CAM memory.

In accordance with the invention, the computer system processes Ziv-Lempel compressed data with a functional unit having a computer operating system, a main system memory and a content addressable memory, and a secondary memory for retrieval and storage of data, and means to address secondary memory for retrieval and storage of data.

An application program and a ZLWCAM data compression paridigm (which operates within an application program or as pad of the operating system) includes steps for processing data from said application program and compressing it to utilize less data storage in said secondary memory.

The content addressable memory is utilized during execution of said ZLWCAM data compression paridigm to accelerate the process of compression of application program data.

These and other improvements are set forth in the following detailed description. For a better understanding of the invention with advantages and features, refer to the description and to the drawings.

BRIEF DESCRIPTION OF THE DRAWINGS

FIG. 5 describes the flow of the ZLWCAM algorithm.

FIG. 6 is a diagram showing how the various fields of the ZLWCAM algorithm, as described in FIG. 5, can be mapped into a CAM word consisting of 56 bits. The ZLWCAM algorithm can be implemented on CAM words of any length. This 56 bit sized diagram serves merely as an example implementation. Various other sized CAM words may be more advantageous or optimal for differing input data file sizes or those data files with differing characteristics.

FIG. 7 describes the flow of the ZLWCAM string entry table data pruning algorithm.

FIG. 8 illustrates compression of a sample text data string.

Our detailed description explains the preferred embodiments of our invention, together with advantages and features, by way of example with reference to the drawings.

Figure 1:
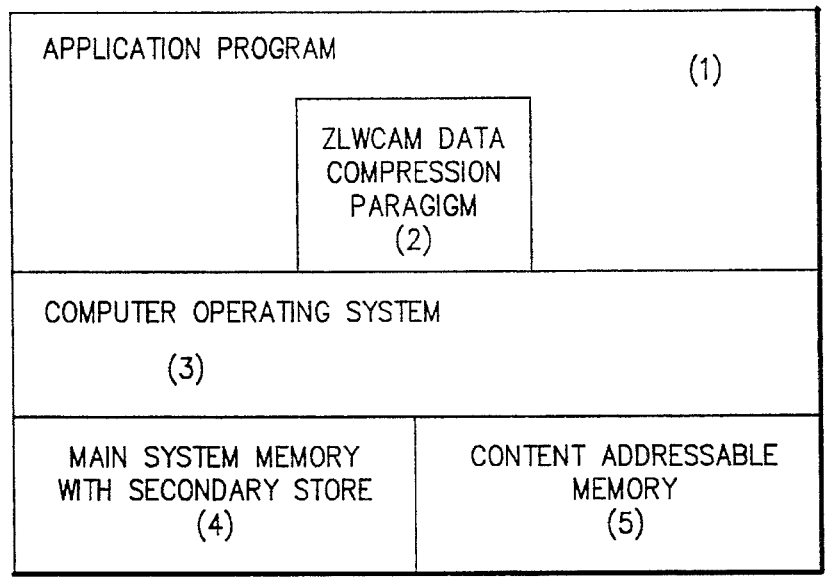
FIG. 1 shows schematically an overview of the preferred embodiment of the computer system, and particularly shows how the ZLWCAM paradigm (2) fits into either the application program (1) or as part of the computer operating system (3) to interface the application program to the various main (4) and content addressable (5) memories. Such placement of the paradigm allows for the implementation of efficient and accelerated ZLW data compression and decompression using the CAM memory.
Figure 2:
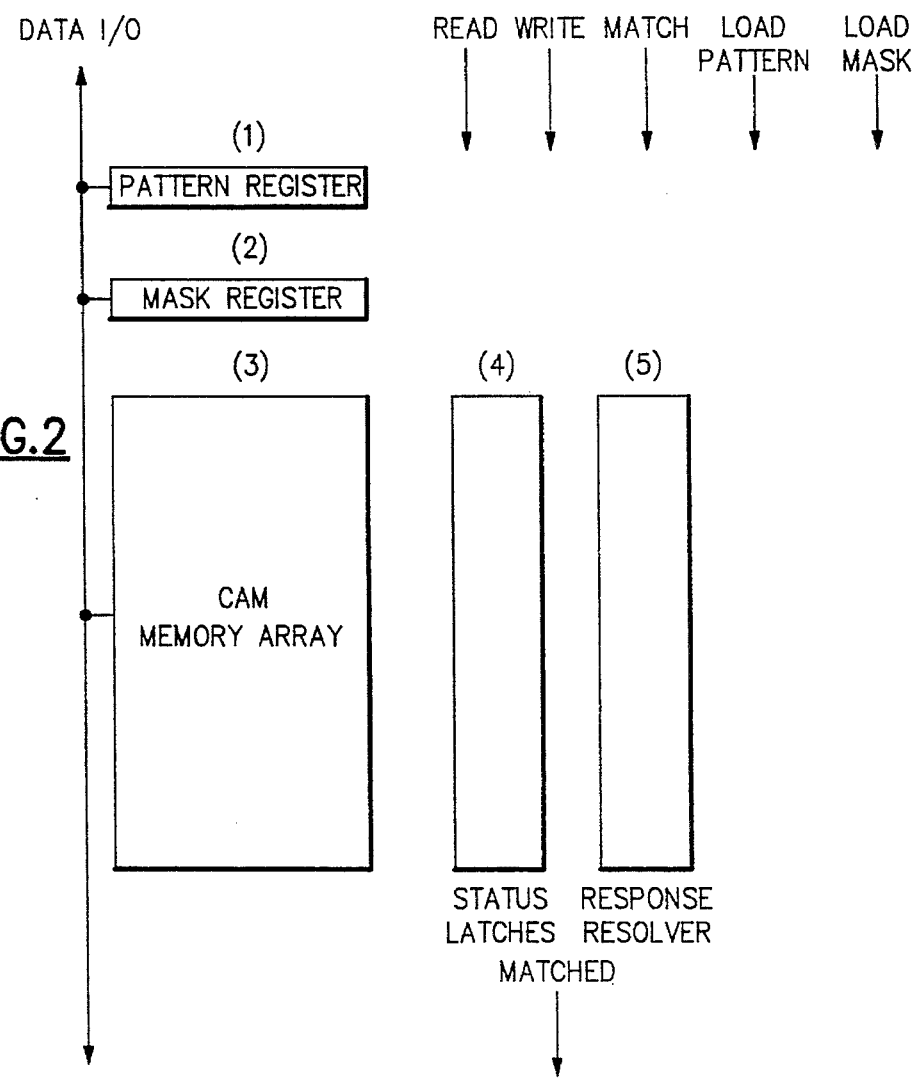
FIG. 2 shows the general processing components of a content addressable, or associative, memory. It is described in greater detail in a following section.
Figure 3:
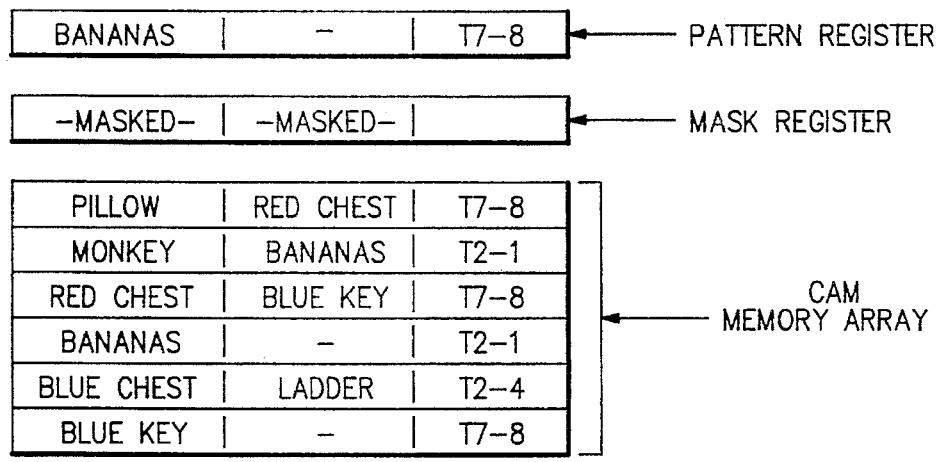
FIG. 3 shows an example of data loaded in a CAM.
Figure 4:
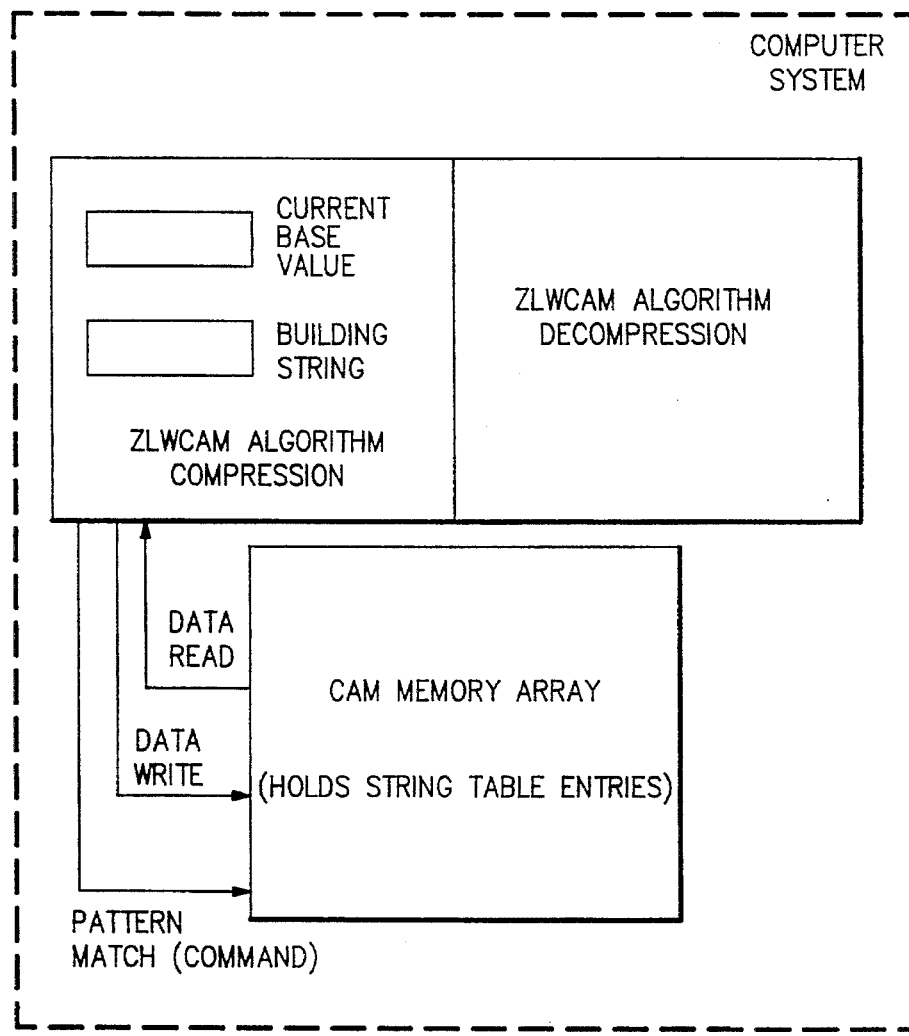
FIG. 4 shows how the ZLW compression algorithm interfaces and uses the CAM. The decompress algorithm operates similarly.

The following section expounds on FIG. 2 and FIG. 3. It serves as precursor information before the detailed description of the invention.

OVERVIEW DESCRIPTION OF CONTENT ADDRESSABLE MEMORY (CAM)

Referring to FIG. 2: CAM is a memory in which the data is accessed by contents, not by address. Selecting a word or words in CAM to access for reading or writing is done by matching the contents of the CAM against a supplied pattern. Those words which match the pattern are selected for access. CAMs perform this pattern matching operation concurrently against all memory locations, that is, against all stored data.

A representative CAM is shown in FIG. 2 and is described below. A CAM consists of an m word by n bits per word storage array (3), like a conventional random access memory (RAM), but without address lines. Additionally, it contains a comparison function cell at each bit location in the memory array, and several other registers. The mask register (2) and pattern register (1) serve to select words within the CAM memory array for reading and writing. A pattern used as the search argument is placed into the pattern register. Fields within the word which are not to take part in the matching operation are masked off by setting appropriate bits in the mask register. The CAM is then instructed to compare all memory words against the pattern register. This is performed by the comparator function cell located at each storage bit. All comparator cells function in unison.

Operations performed in a CAM consist of three basic functions:

Reading data out of the memory array,

Writing data into the memory array, and

Matching, or Searching, the memory contents.

The Read and Write operations are similar to conventional random access memories and are not described here.

A match operation in a CAM causes the pattern and mask registers to be used to search memory array. All words in the memory array which satisfy the match specified by the two registers are said to be selected.

As an example, assume a CAM which is character oriented, see FIG. 3. Each word of the CAM is divided into three datum pads, as shown in the figure. Some of the fields are free, i.e. do not have a value bound in them, while others are bound to a value. Fields which are unbound are indicated by a dash.

In the figure, the data which is to be searched for is (–, –, T7-8). The pattern register specifies a search for the element (Bananas, –, T7-8) while the mask register indicates that the first two fields should be ignored in the actual match: they are masked off. Thus, only the last field is used in the search. Executing a match operation with the CAM contents shown would result in three rows of the CAM being selected. These are:

(Pillow, Red Chest, T7-8)

(Red Chest, Blue Key, T7-8)

(Blue Key, –, T7-8 )

DETAILED DESCRIPTION OF THE INVENTIONS

It is well known that the use of CAM can result in significant performance improvements when string searching or string matching is performed.[2] This process is central to the operation of the ZLW algorithm. Thus, it can be concluded that replacing the typical hash table implementation of ZLW with a CAM based scheme will significantly increase the processing speed and power of ZLW. We will refer to our new implementation of the ZLW data compression technique employing a CAM as ZLWCAM.

[2] Work has been done by Drs. Peter M. Kogge and J. David Bezek in the area of expert systems using content addressable memories. This work did not involve ZLW nor any other type of data compression. However, the fundamental principle of string comparison and matching is central to expert system processing. These systems are typically implemented with table look-up or a hashing scheme. It was found that use of CAM to perform the equivalent string comparison or matching resulted in significant performance improvements. These improvements would translate directly to ZLW implemented using a CAM as opposed to the typical hash table scheme.

FIG. 5 shows the ZLWCAM algorithm. In the figure, text in italics is descriptive information for the processing step. A sample compression of the string This hotel is his home.

is given in FIG. 8. In the figure blanks are shown as the "b" character. The string table operation column shows new string table entries as they are output to the CAM, during input of the input string. Entries in the string table operation column, and the descriptions in FIG. 5, take the following form:

New Code Value←Base Code Value+Append Character.

The code values are the decimal values for the extended ASCII representation of the character. For example, the first Base Code Value, 084, is the letter T. NULL refers to the empty string.

The building string is a dynamic length string variable internal to the algorithm. It is used to accumulate input characters, building a string, until the string no longer resides in the string table, i.e. the CAM. At that point the new string is placed in the string table and the building string is re-initialized to the last character read. That character beings a new string.

Under the output column the actual character output is shown, when appropriate, for readability. Otherwise the decimal Base Code Value is shown.

The performance improvement occurs at the CAM match steps. Each of these is a search of the string table. Using a hashing scheme this would be an O(log n) operation, n=number of entries in the string table. Using CAM it is O(1). Additionally, the string table must be searched on different combinations of fields. See steps 5 and 8 of FIG. 5. Thus, if only one hash table is used, for one field search combination, the other search will result in O(n) processing time. Maintaining multiple hash tables, or some other indexing scheme to reduce search time, for the string table is difficult. Using CAM, all combinations of search fields process in O(1).

The Preferred Embodiment

We turn now to our invention in greater detail. The patentable technique described is a novel implementation of the popular and widely used Ziv-Lempel, or Ziv-Lempel-Welsh, data compression algorithm. This implementation uses the unique processing characteristics of a content addressable memory to accelerate the data compression/decompression operation.

This section describes the preferred solution to the ZLW algorithm when a CAM is employed in the computing system. The preferred solution is presented in two textural form processing flows, in the accompanying descriptive text which follows, and by way of example.

The two accompanying algorithm descriptions, which appear in textual form, see FIG. 5 and FIG. 7 set forth the new data compression algorithm and the associated string table pruning algorithm. The algorithms cover the three components of:

1. String table entries,
2. String table pruning algorithm, and
3. Data decompression.

The following sections describe in detail these algorithms. Examples are also provided.

String Table Entries

FIG. 6 shows a general format for the string table entries as they reside in the CAM. The bit sizes shown are for one possible implementation. ZLWCAM is not limited to those values chosen and will operate correctly and similarly for other values. A table of considerations for these field sizes is given below.

The meanings of the various fields in the :String Table Entry data structure are as follows:

New Code Value: The numerical value assigned to the string represented by this CAM entry. Each entry in the CAM corresponds to an entry in the ZLW string table. The New Code Values begin at one and are assigned in ascending order.

Base Code Value: The numerical value assigned to the existing string to which this Append Character is being added, thus forming a longer string. If the append character is the first character of the string then this field's value is the numerical constant chosen to represent NULL, i.e. the null or empty string.

Use Count: The number of times this base code value plus the append character have been written as an output code.

Append Character: ZLWCAM does not store entire strings in the table with each character read. When a new character is an extension to a string already represented in the table, the numeric code value for that string, along with the new character, termed the append character for the new string, are stored. This leads to a large reduction in the amount of storage required and alleviates the problem of storing and manipulating variable length strings. This idea of storing an append character rather than multiple varying length strings is in the prior art.

Some considerations, for a particular implementation of ZLWCAM, for the bit sizes in the string table entries are:

New Code Value: As it is the code value that is output, if the size is large there is the potential for poor compression performance. Given a data encoding of x bits per character, if the size of the New Code Value is y bits, and y>>x, one or two input characters may generate an output code value. This is especially true in the early stages of processing an input string, or for small files. Thus 1x or 2x input bits will generate y output bits which is an increase in size;, not a compression.

Conversely, if y is small, for example, fixed at x+1, then the string table will fill quickly and require frequent pruning. A dynamic value of y, starting at x+1 and bounded at some reasonable value, is the usual method of implementation. This is also the recommended implementation for ZLWCAM.

Base Code Value: This must be the same length as the New Code Value. Additionally, the size of the Base Code., Value must change should the New Code Value size be increased.

Use Count: A value which is too small, such as 8 bits, will be quickly exceeded by frequently appearing strings. This can occur in text files for words like "the". Exceeding the field size may result in a program error, or at least will cause the counter to roll over to 0. Should a prune operation be conducted at or soon after this roll over, the frequently used string will be removed from the String Table. This will result in a performance degradation of ZLWCAM. Thus, some larger, and perhaps dynamic value, of the Use Count is suggested. The example implementation in FIG. 6 is 16 bits.

Append Character: The number of bits is dependent on the number of bits used by the processor architecture to represent one character. For example, Extended ASCII uses an 8 bit representation.

String Table Pruning Algorithm

When the String Entry Table, i.e. the CAM, becomes filled, some action needs to be taken for correct and efficient processing to continue. If the table is allowed to remain static at the "full" condition, the degree of data compression can suffer. This occurs if the contents of the successive input data change greatly from the strings stored in the table. The amount of compression degrades since only small portions of the stored strings, down to just the original literal characters initially placed in the table, are used to encode the input.

As outlined in [1], several methods of proceeding are available. Each will work with ZLWCAM. This disclosure indicates a data structure, FIG. 6, which contains a code value use count. With a CAM it is straight forward to search for those entries with use counts below some threshold, known as the Prune Threshold. Those string entries in the string table are then removed.

Individual string table entries may not be randomly removed as they may be components of other, longer, strings. FIG. 7 describes the algorithm to remove all string entries with use count below a threshold. Text in italics describes each step.

Data Decompression

The CAM can also be used during the data expansion, or decompression, operation of the ZLW algorithm. The performance improvement argument holds as per the compress operation. The decompress operation requires large amounts of string comparisons to be performed: code words read from the input string must be matched against the decompress string table to reconstruct the original data string.

For purposes of this disclosure the decompress algorithm is not expressly described. Decompress for ZLWCAM is a similar extension to the basic ZLW algorithm.

Alternative Preferred Embodiments

As previously stated, the ZLW algorithm is widely used in the commercial and government sectors. Any general purpose processing system with a CAM available for application program use can implement ZLW with the ZLWCAM algorithm to gain the expected performance improvement.

Recent commercial activity has seen the introduction of very affordable CAM cards for IBM PS/2 (TM) and DEC VAX (TM) machines. Additionally, CAM chips are now available from various sources allowing CAM to be built into general purpose as well as specific or embedded processing systems. ZLWCAM is a simple algorithm that can be used on any of these machines to effect significant data reduction[3] at a very high rate[4] and without significantly high cost.

[3]This is a widely known and accepted fact of the basic ZLW algorithm.
[4]This is a widely accepted fact of using CAM for pattern matching operations.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A computer system for processing Ziv-Lempel compressed data, comprising
   a functional unit having, in combination, a computer operating system, a main memory and a content addressable memory, and a secondary memory for retrieval and storage of data, and a means to address secondary memory for retrieval and storage of data,
   an application program and a ZLWCAM data compression paradigm, said ZLWCAM data compression paradigm including means for processing data from said application program and compressing it to utilize less data storage in said secondary memory,
   said content addressable memory being utilized during execution of said ZLWCAM data compression paradigm to accelerate the process of compression of application program data, and
   means for determining if a data field of an item of compressed data specifies another item of compressed data.

2. A computer system according to claim 1 wherein said content addressable memory has a pattern register, a mask register and a CAM memory array with status latches and a response resolver for said CAM memory array.

3. A computer system according to claim 2 wherein said ZLWCAM paridigm while operating within said computer system performs compression and decompression steps, and wherein said compression steps include reading and writing data to and from said CAM memory array, the writing of data to said CAM memory array including a precursor step of a pattern match for selecting CAM memory components for reading and writing.

4. A computer system according to claim 3 wherein said ZLWCAM paradigm includes the means for:
   initializing a string table for CAM locations to empty, and then filling initialized locations with code values for initial literal characters in a character set,
   setting in memory a current base value and building string to null,
   maintaining an execution loop which executes until all input data is exhausted,
   performing a match operation using an input character and current Base Value against Append Character and Base Code Value CAM fields respectively,
   and then if string in string table shows a match of previous step is successful, setting the Current Base Value to Base Code Value from matching CAM word, but if the Base Code Value is NULL then using a character encoding value for the character just input, and
   output current Base Code Value for the latest matching string and
   performing a match in the CAM using the Current Base Value against a New Code Value field to locate a unique CAM entry which is a representation of the string whose code value was just output, and increment a Use Count field of that CAM entry, then
   write a new string table entry to CAM using Current Base Value as the Base Code Value, current input character as an append character and the next larger unused Base Code Value as a Code Value, and
   set a Building String to contain only the current input character, and set the Current Base Value to the character encoding value for the character just input to start construction of a new string pattern.

5. A computer system according to claim 1 wherein the ZLWCAM paradigm includes means for efficient pruning of dynamic string/substring tables.

6. A computer system according to claim 1 wherein the ZLVCAM paradigm includes means for efficient pruning of dynamic string/substring tables which employs a method of imbedding a use count within items in a string table using CAM searching to quickly trim off low use fields.

7. A computer system according to claim 2 wherein the computer system includes within operations of said ZLWCAM paradigm means for implementing the Ziv-Lempel, Ziv-Lempel-Welch, (ZLW) data compression algorithm using said content addressable memory.

8. A method to uncompress ZLW compressed strings using CAM, comprising the steps of:
   initializing a string table for CAM locations to empty, and then filling initialized locations with code values for the initial literal characters in the character set,
   setting in memory a current base value and a building string to null,
   Maintaining an execution loop which executes until all input data is exhausted,
   performing a match operation using an input character and current Base Value against Append Character and Base Code Value CAM fields respectively,
   and then if string in string table shows a match of previous step is successful, setting a Current Base Value to Base Code Value from matching CAM word, but if a Base Code Value is NULL then using a character encoding value for a character just input, and
   output the current Base Code Value for a latest matching string and
   performing a match in a CAM using the Current Base Value against a New Code Value field to locate a unique CAM entry which is the representation of the string whose code value was just output, and increment a Use Count field of that CAM entry, then
   write a new string table entry to CAM using Current Base Value as a Base Code Value, current input character as an append character and a next larger unused Base Code Value as the New Code Value, and
   set the Building String to contain only a current input character, and set the Current Base Value to the character encoding value for a character just input to start construction of a new string pattern.

9. A method for efficient pruning of dynamic string/substring tables, comprising the steps of:
   pattern matching using a CAM, and marking words which have a Use Count<=Prune Threshold,
   picking one of the marked CAM words from said pattern matching step and unmark it, but if no words remain marked then exit,
   if a Base Code Value of the word selected in step 2 is NULL then going to said picking step,
   extracting a New Code Value from the word of said picking step, Perform a CAM Match using the New Code Value against the Base Code Value field, if no matches occur in the CAM removing the CAM word entry selected in said picking step, extracting the Base Code Value from the word of said picking step, Mark that CAM entry which has its New Code Value equal to this Base Code Value, returning to said picking step.

\* \* \* \* \*